United States Patent [19]

Morita et al.

[11] Patent Number: 4,780,791
[45] Date of Patent: Oct. 25, 1988

[54] CARD-SHAPED MEMORY HAVING AN IC MODULE

[75] Inventors: Hiroyuki Morita; Nobuhide Takada, both of Yokohama, Japan

[73] Assignee: Fujisoku Electric Co., Ltd., Kawasaki, Japan

[21] Appl. No.: 34,028

[22] Filed: Apr. 2, 1987

[30] Foreign Application Priority Data

Apr. 8, 1986 [JP] Japan .............................. 61-52597[U]
Apr. 8, 1986 [JP] Japan .............................. 61-52598[U]

[51] Int. Cl.<sup>4</sup> ................................................ H05K 1/14
[52] U.S. Cl. .................................... 361/395; 235/492; 361/399
[58] Field of Search ........ 235/492; 361/380, 392–395, 361/399, 401, 410, 412, 413; 339/60, 62, 95, 96, 607–610

[56] References Cited

U.S. PATENT DOCUMENTS

| 2,986,675 | 5/1961 | Burson et al. | 361/392 |
| 3,372,310 | 3/1968 | Kantor | 361/392 |
| 3,509,270 | 4/1970 | Dube et al. | 361/412 |
| 3,599,046 | 8/1971 | Spreitzer | 361/394 |
| 3,973,817 | 8/1976 | Stalley et al. | 439/60 |
| 4,360,727 | 11/1982 | Lehmann | 235/492 |
| 4,642,735 | 2/1987 | Hodsdon et al. | 361/394 |
| 4,652,976 | 3/1987 | Fushimoto | 361/395 |

Primary Examiner—M. H. Paschall
Assistant Examiner—Gergory P. Thompson
Attorney, Agent, or Firm—Ladas & Parry

[57] ABSTRACT

In a card-shaped memory having an IC module, a circuit board having integrated circuits thereon is provided in a card body. A plurality of circuit patterns are provided on the board. First ends of the patterns are connected to the integrated circuits. The second ends are disposed on one side of this board. A plurality of contacts are provided. The base ends of the contacts are connected to these circuit patterns. The leading ends are placed in connection holes in the card body. A holding member holds a plurality of the contacts together.

7 Claims, 3 Drawing Sheets

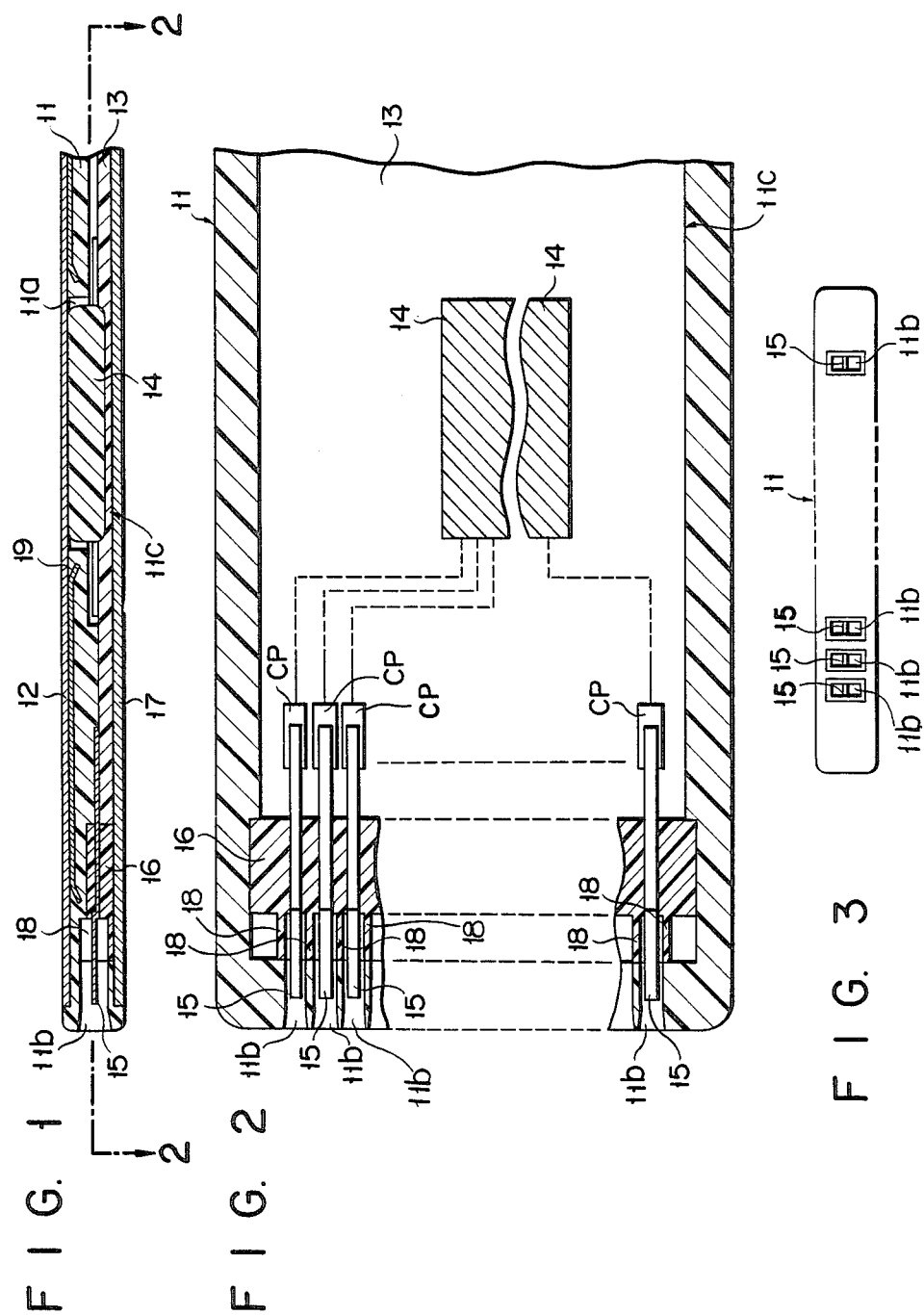

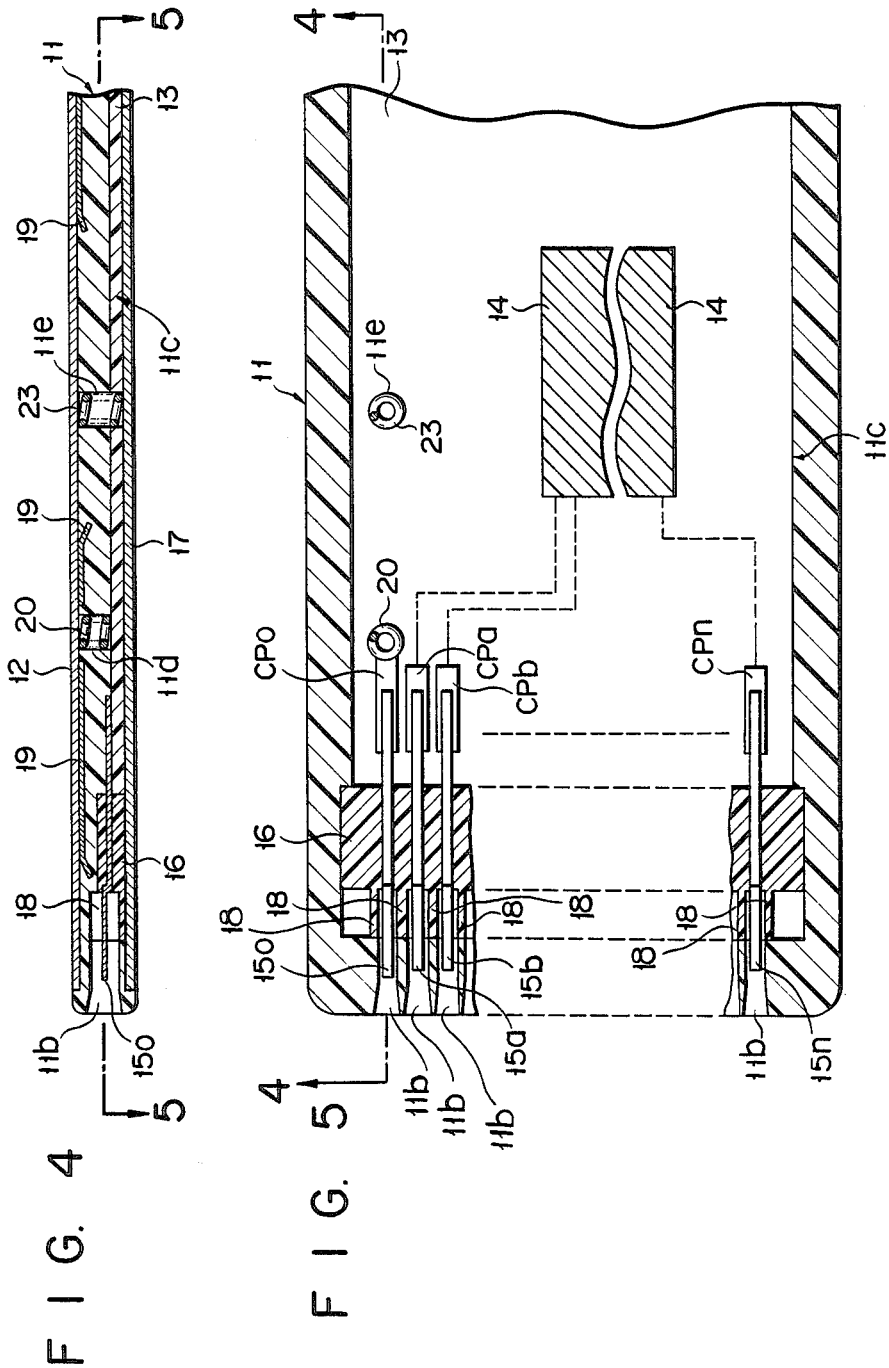

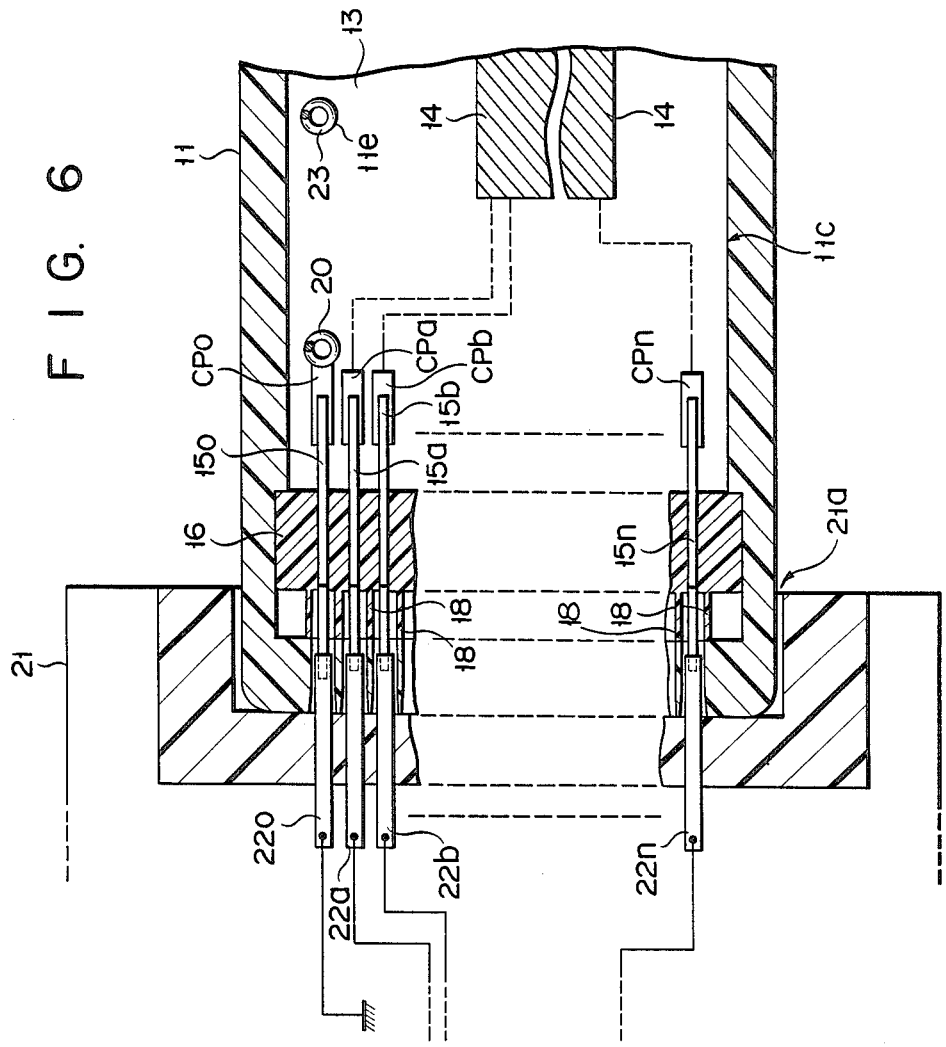

CARD-SHAPED MEMORY HAVING AN IC MODULE

BACKGROUND OF THE INVENTION

This invention relates to a card-shaped memory of the type in which an integrated circuit module is contained in a card body, and which is used for an external memory device of personal computers, for example.

As well known, in this type of card-shaped memory, the card body contains a printed circuit board on which integrated circuit modules are arranged. The card body, for example, is loaded into a read/write device, for the reading/writing of data into the integrated circuit.

In the conventional card-shaped memory, a plurality of printed circuit contacts connected to the integrated circuit, are provided on the end face of one of the sides of the printed circuit board. When the card body is loaded into the read/write device, the contacts come in contact with clip like connecting members which are mounted to the read/write device.

For printed circuit patterned contacts, many problems arise when the contacts are connected to connecting members. For example, the circuit pattern may have peeled off or be worn, resulting in poor contact. The thinness of the circuit pattern quickens the wear problem and reduces the lifetime of the contacts.

When the circuit pattern is used for the contacts, a relatively high mechanical strength is required for the printed wiring board per se. For this reason, expensive synthetic resin such as polyimide was used for the material of the board.

Frequently, static electricity at a high voltage is induced on the surface of the card body of the card-shaped memory. Static electricity may flow into the internal circuit of the card body through the contacts, when the card body is inserted into the read/write device. This type of card-shaped memory contains an SRAM (static random access memory) as the integrated circuit. When a high voltage enters the card body, it may cause the integrated circuit to operate erroneously or, more adversely to be destroyed.

SUMMARY OF THE INVENTION

An object of this invention is to provide an inexpensive card-shaped memory with an improved durability of contacts.

Another object of this invention is to provide a card-shaped memory in which a plurality of contacts are accurately and easily connected to a printed circuit board.

Yet another object of this invention is to provide a memory card device with a simple construction, which is free from the erroneous operation and destruction of the integrated circuit of the memory, which are due to high voltage static electricity.

According to one aspect of this invention, there is provided a card-shaped memory having an IC module including a card body. Connection holes are provided on the side face of the card body. A board is provided in the card body, on which integrated circuits are arranged. A plurality of circuit patterns, first ends of which are connected to the integrated circuits, and second ends of which are disposed on one side of the board. A plurality of contact means have leading ends being placed in the connection holes, and base ends being respectively connected to the circuit patterns. Holding means are laid on one side of the board, holding the plurality of contact means together.

According to another aspect of this invention, there is provided a card-shaped memory having an IC module including a card body. A board provided in the card body, and on which integrated circuits are arranged. First contact means is provided to the card body, and connected to the integrated circuits. The first contact means further being for connection to first connector means of an external device, for data transfer. Second contact means is provided to the card body. The second contact means protruding further than the first contact means, and being for connection to grounded second connector means of the external device. A conductive member is provided on the surface of the card body, and connecting means for electrically connecting this conductive member to the second contact means.

BRIEF DESCRIPTION OF THE DRAWINGS

FIG. 1 shows a longitudinal cross sectional view of a key portion of an embodiment of a card-shaped memory according to this invention;

FIG. 2 shows a cross sectional view taken on line 2—2 of FIG. 1;

FIG. 3 shows a side view of the memory of FIG. 2;

FIG. 4 shows a longitudinal cross sectional view taken on line 4—4 of FIG. 5 of a key portion of another embodiment of a card-shaped memory according to this invention;

FIG. 5 shows a cross sectional view taken on line 5—5 of FIG. 4; and

FIG. 6 shows a partial cross sectional view of a portion of the card-shaped memory when it is connected to a read/write device.

DETAILED DESCRIPTION OF THE PREFERRED EMBODIMENTS

Some specific embodiments of this invention will be described referring to the accompanying drawings.

In FIGS. 1 and 2, card body 11 made of synthetic resin is provided with a mounting section 11c. Front panel 12, which is conductive, for example, is provided on the surface of card body 11. Printed circuit board 13 is placed in mounting section 11c of card body 11. A plurality of integrated circuits 14, only one of which is shown, including SRAMs (static random access memories), for example, are arrayed on printed circuit board 13. These integrated circuits 14 are accommodated in mounting hole 11a of card body 11. On one side of printed circuit board 13, are disposed the second ends of a plurality of circuit patterns CP whose first ends are connected to integrated circuit 14.

As shown in FIG. 3, a plurality of connection holes 11b communicating with mounting section 11c are provided on one side of card body 11. The leading ends of contacts 15 made of conductive metal are placed in the connection holes 11b, respectively. These contacts 15 are molded at the center integral with holding member 16, with predetermined spacial intervals among contacts 15 and predetermined positions of the leading ends of contacts 15. The base ends of contacts 15 are previously soldered to circuit patterns CP of printed wiring board 13. The contacts 15 thus soldered, together with printed circuit board 13, are accommodated in card body 11.

Holding member 16 is first laid on the side face of printed circuit board 13. Then, the base ends of contacts 15 are soldered to patterns CP. The leading ends of contacts 15 are inserted into connection holes 11b. Under this condition, printed circuit board 13 and holding member 16 are placed in mounting section 11c of card body 11. Afterwards, rear panel 17, which is conductive, for example, is set on the rear side of card body 11, to cover printed circuit board 13 mounted in mounting section 11c and holding member 16.

Separating walls 18 are upstanding from holding member 16, to separate the leading ends of contacts 15 one another. Additionally, card body 11 is provided with reinforcing member 19.

Thus, contacts 15 are made of metal, separately from printed circuit board 13. Contacts 15 are soldered to the circuit patterns CP of printed circuit board 13. With such a structural feature, the durability of contacts 15 is superior to that of printed circuit contacts. In this respect, occurrence of poor contact of contacts 15 can be restricted to the minimum.

Further, the requirement for the mechanical strength of printed circuit board 13 is not strict, because the circuit pattern is not used for the contacts. This fact eliminates the need for the expensive board and leads to cost reduction of the card-shaped memory.

It is further noted that respective contacts 15 are positioned by holding member 16, and then fixed to printed circuit board 13. This structural feature stably positions those contacts 15 and provides easy soldering work of contacts 15 with circuit patterns CP.

Referring now to FIGS. 4 and 5, there is shown a second embodiment of this invention. Like symbols are applied for like portions of FIGS. 1 to 3 for simplicity.

As shown in FIGS. 4 and 5, the leading ends of first contacts 15a to 15n made of conductive metal are disposed in a plurality of connection holes 11b of card body 11. The leading end of second contact 15o is also placed there, farther protruding than those of other contacts 15a to 15n. First contacts 15a to 15n, and second contact 15o are molded integral with holding member 16 on a longitudinal centerline thereof. Predetermined spacial intervals between contacts 15a to 15n, and 15o and also provided for the leading ends thereof.

The base ends of those first contacts 15a to 15n are soldered to first circuit patterns CPa to CPn connecting to integrated circuits 14. The base end of second contact 15o is soldered to second circuit pattern CPo laid on the surface of printed circuit board 13.

As is shown in FIG. 4, card body 11, which corresponds to second circuit pattern CPo, has through hole 11d. Conductive coiled spring 20 is inserted in this hole 11d. Spring 20 electrically connects front panel 12 and second circuit pattern CPo. Further, one through hole 11e is cut in card body 11 and printed circuit board 13. Conductive coiled spring 23 is inserted in this hole 11e. Spring 23 sets front panel 12 and rear panel 17 at the same potential.

FIG. 6 shows a partial cross sectional view illustrating the card body 11 when it is inserted into read/write device 21 as an external device. Loading section 21a of read/write device 21 is provided with connection members 22a to 22n to respectively corresponding to first contacts 15a to 15n. Connection members 22o is further provided corresponding to second contact 15o. These connection members 22a to 22n, and 22o are each shaped like a clip, and connected to contacts 15a to 15n, and 15o when those are inserted. The leading ends of those connection members 22a to 22n, and 22o are aligned with one another. Connection member 22o is grounded, while connection members 22a to 22n are connected to a read/write circuit (not shown).

With such an arrangement, when card body 11 is connected to read/write device 21, second contact 15o is first connected to connection member 22o of read/write device 21. Then, first contacts 15a to 15n are connected to the corresponding connection members 22a to 22n, respectively. With this, the static electricity charged into front and rear panels 12 and 17 flows into connection member 22o of read/write device 21, through coiled spring 20 and second contact 15o, before connection of first contacts 15a to 15n.

As described above, separately from first contacts 15a to 15n, second contact 15o is provided connecting to the grounded connection member 22o of read/write device 21. Thus, the static electricity charged into front and rear panels 12 and 17 is prevented from flowing into integrated circuits 14, when card body 11 is coupled with the external device, thereby preventing the erroneous operation and destruction of integrated circuits 14.

The leading end of second contact 15o is extended farther than those of first contacts 15a to 15n. Therefore, second contact 15o first contacts the connection member 22o of the external device, when card body 11 is inserted into the read/write device 21. Such a structure can completely prevent the static electricity from entering integrated circuits 14.

In the above-mentioned embodiment, a plurality of connection holes 11b are formed on the side face of card body 11. Contacts 15 are placed in these connection holes 11b. Alternatively, one elongated hole is formed in the side face of card body 11 in place of holes 11b, and all the contacts are placed in the elongated hole.

It should be understood that this invention is not limited to the specific embodiments as mentioned above, but may be variously changed and modified within the scope of this invention.

What is claimed is:

1. A card-shaped memory having an IC module comprising:
    a card body (11)
    connection holes (11b) provided on the side face of said card body;
    a board (13) provided in said card body, and on which integrated circuits are arranged;
    a plurality of circuit patterns (CP), first ends of said circuit patterns being connected to said integrated circuits, and second ends of said circuit patterns being disposed on one side of said board;
    a plurality of contact means (15), leading ends of said contact means being placed in said connection holes and not extending beyond said body, and base ends of said contact means being respectively connected to said circuit patterns; and
    holding means (16) laid on one side of said board holding said plurality of contact means together.

2. A card-shaped memory having an IC module comprising:
    a card (11);
    a board (13) provided in said card body, and on which integrated circuits are arranged;
    first contact means (15a–15n) provided in said card body, and connected to said integrated circuits, said first contact means further being for connecting to first connector means of an external device, for data transfer;
    second contact means (15o) provided in said card body, said second contact means protruding farther than said first contact means, and being for connecting to grounded second connector means of the external device;

a conductive member (12) provided on the surface of said card body; and connecting means comprising a conductive spring (20) for electrically connecting this conductive member to said second contact means.

3. A card shaped memory having an IC module, comprising:

a card body (11) having connection holes provided at a side section thereof;

a board (13) having an integrated circuit provided on and within said card body;

first contact means (15a–15n) connected at a base end to the integrated circuit and having a free forward end located within a corresponding connection hole to allow data transfer;

second contact means (15o) having a base end mounted on said board and a free forward end extending beyond the first contact means, said second contact means being locatd within a corresponding connection hole;

a conductive member (12) provided on a surface of said card body; and third contact means (20) for electrically connecting said conductive member to said second contact means.

4. The card shaped memory according to claim 3, wherein said first and second contact means are held by a holding means situated along one side section of said board.

5. The card shaped memory according to claim 3, wherein said integrated circuit is comprised of a static random access memory.

6. The card shaped memory according to claim 3, further comprising:

said first contact means is connected to said integrated circuit by a first circuit pattern; and said second and third contact means being interconnected by a second circuit pattern.

7. The card shaped memory according to claim 3 wherein said third contact means is comprised of a conductive spring.

* * * * *